(12) United States Patent
Deppe et al.

(10) Patent No.: US 6,972,226 B2
(45) Date of Patent: Dec. 6, 2005

(54) CHARGE-TRAPPING MEMORY CELL ARRAY AND METHOD FOR PRODUCTION

(75) Inventors: Joachim Deppe, Dresden (DE); Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 3 days.

(21) Appl. No.: 10/815,223

(22) Filed: Mar. 31, 2004

(65) Prior Publication Data

US 2005/0227426 A1 Oct. 13, 2005

(51) Int. Cl.[7] .......................................... H01L 21/8238

(52) U.S. Cl. ..................... 438/201; 438/211; 438/257; 438/263; 438/264; 438/591; 438/593; 257/314; 257/315; 257/316; 257/324; 257/326

(58) Field of Search ................................ 257/239, 261, 257/295, 298, 314–326; 438/201, 211, 216, 438/241, 257, 258, 260–266, 591, 593

(56) References Cited

U.S. PATENT DOCUMENTS

| 5,679,591 | A | 10/1997 | Lin et al. |
| 5,760,437 | A | 6/1998 | Shimoji |
| 5,768,192 | A | 6/1998 | Eitan |
| 5,787,035 | A | 7/1998 | Kang et al. |
| 6,011,725 | A | 1/2000 | Eitan |
| 6,469,935 | B2 | 10/2002 | Hayashi |
| 2004/0041199 | A1 | 3/2004 | Kim |
| 2004/0135194 | A1 * | 7/2004 | Lee ............................ 257/315 |
| 2004/0164345 | A1 * | 8/2004 | Kleint et al. ................ 257/324 |

FOREIGN PATENT DOCUMENTS

WO   WO 2004/053982 A2   6/2004

* cited by examiner

Primary Examiner—Andy Huynh
(74) Attorney, Agent, or Firm—Slater & Matsil, L.L.P.

(57) ABSTRACT

In a memory cell array comprising charge-trapping memory cells, local interconnects along the direction of the wordlines for connecting source/drain regions of adjacent memory cells to bitlines are formed by selective deposition of silicon or polysilicon bridges at sidewalls of the semiconductor material within upper recesses in the dielectric material of shallow trench isolations running across the wordlines.

17 Claims, 7 Drawing Sheets

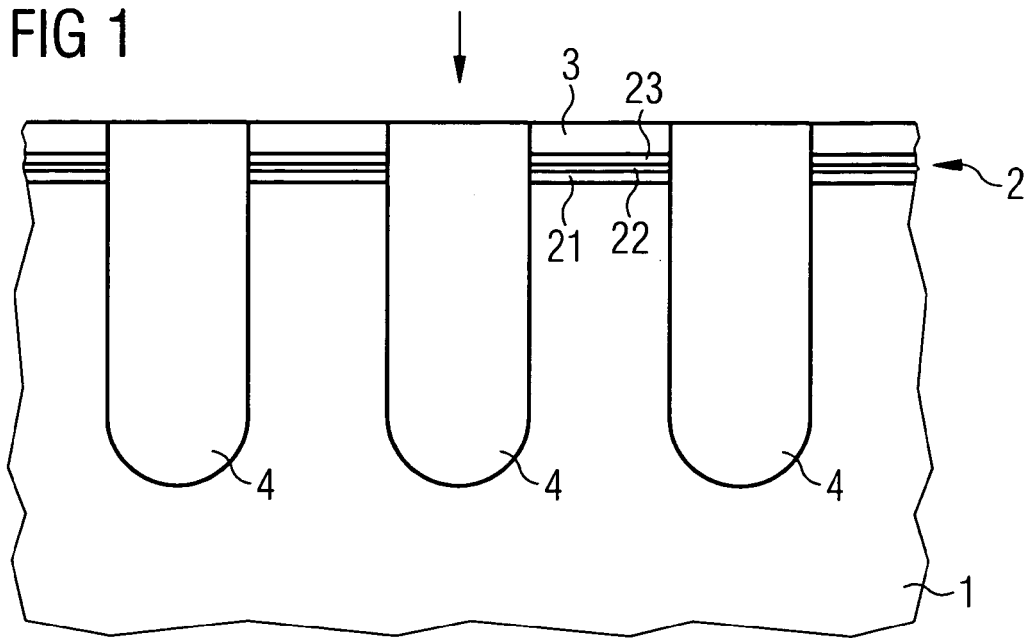
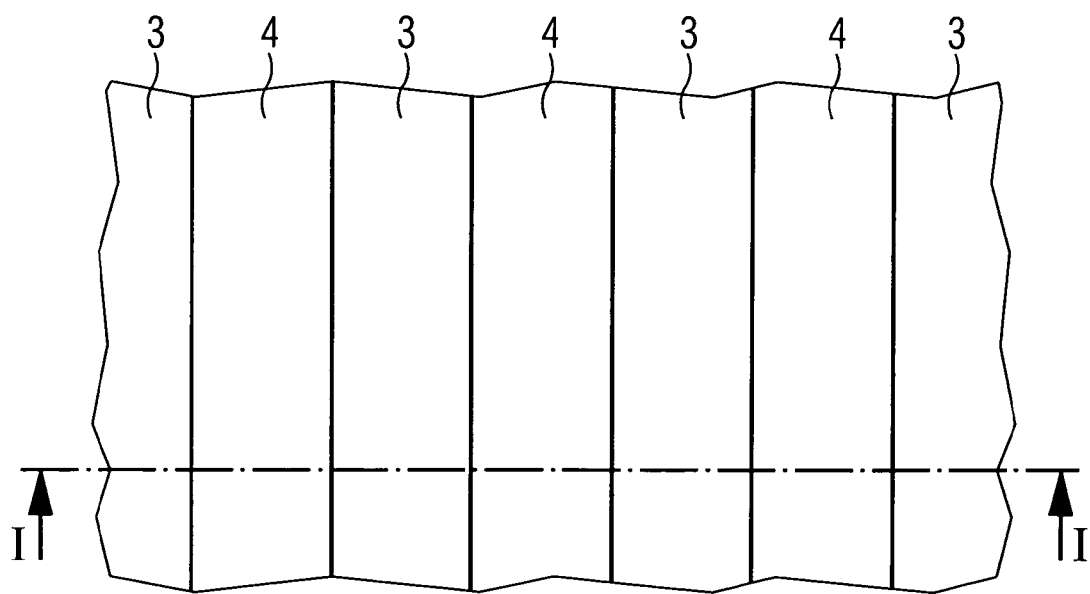

CHARGE-TRAPPING MEMORY CELL ARRAY AND METHOD FOR PRODUCTION

TECHNICAL FIELD

The invention relates to a memory cell array comprising charge-trapping memory cells with local interconnects and an especially adapted method for producing this memory cell array.

BACKGROUND

Memory devices with charge-trapping layers, especially SONOS memory cells comprising oxide-nitride-oxide layer sequences as storage medium, are usually programmed by channel hot electron injection. U.S. Pat. Nos. 5,768,192 and 6,011,725 disclose charge-trapping memory cells of a special type of so-called NROM cells, which can be used to store bits of information both at the source and at the drain below the respective gate edges. The programmed cell is read in reverse mode to achieve a sufficient two-bit separation. Erasure is performed by hot hole injection.

U.S. Pat. No. 6,469,935 B2 discloses a non-volatile memory array architecture and its operation methods comprising local interconnects formed by connection regions of doped semiconductor material. Each of a number of first connection regions connects a first cluster of cells in the direction of the wordlines, this cluster comprising a first cell and a second cell that are adjacent in the direction of the bitlines with a third cell and a fourth cell that are adjacent in the direction of the wordlines to the first and second cells, respectively, and each of a number of second connection regions connects together in the direction of the wordlines a second cluster of cells comprising a cell of the first cluster, a fifth cell adjacent in the direction of the bitlines to said common cell, a sixth cell and a seventh cell that are adjacent in the direction of the wordlines to the common cell and the fifth cell, in which arrangement a first portion of the bitlines connect together a plurality of first connection regions and a second portion of the plurality of bitlines connect together a plurality of second connection regions. This means that the bitlines are connected to the connection regions in next but one of the interspaces between the wordlines. In each case, the source and drain regions of two pairs of memory cells that are subsequently arranged along the two adjacent wordlines are connected. Thus, each local interconnect connects a bitline to the source/drain regions of quadruples of memory cells arranged within a square in such a manner that two of these memory cells are adjacent in the direction of the wordlines and the other two memory cells of this quadruple are adjacent to the first two memory cells, respectively, on the same side, in the direction of the bitline. Each of the memory cells within such a quadruple belongs to exactly one further quadruple of memory cells, the second source/drain region of one of the cells being connected by a further local interconnect to first source/drain regions of the other three memory cells of the respective further quadruple of memory cells. If the memory cells are enumerated along the wordlines by a continuous enumeration, the local interconnects connect the source/drain regions of the odd-numbered memory cells on one side of the respective wordline to the source/drain regions of the subsequent even-numbered memory cells. On the other side of the same wordline, the local interconnects connect the source/drain regions of the even-numbered memory cells to the subsequent odd-numbered cells, according to this continuous enumeration. The local interconnects pertaining to memory cells of both adjacent wordlines connect source/drain regions of a total of four memory cells, which are arranged in said square quadruples.

The local interconnects can be formed by short polysilicon strips arranged alongside the wordlines within the gaps between the wordlines. In this embodiment, no connection regions formed as doped regions in the semiconductor material between adjacent source/drain regions are necessary. The doped regions can be restricted to the actual source/drain regions. The local interconnects can be produced either by first depositing electrically conductive polysilicon into the gaps between the wordlines, subsequently structuring the polysilicon into the local interconnects, and then filling the spaces between adjacent interconnects with dielectric material; or by first depositing the dielectric material, then forming contact holes having a dimension of the interconnects, and then depositing electrically conductive material into these contact holes.

SUMMARY OF THE INVENTION

The preferred embodiment inventive charge-trapping memory cell array comprises a semiconductor body, shallow trench isolations arranged parallel at a distance to one another at a main surface of the semiconductor body, memory cells arranged at this main surface, each of the memory cells comprising a channel region, source/drain regions formed by (highly) doping the semiconductor material, and a memory layer sequence provided for charge-trapping and composed of dielectric materials, wordline stacks arranged parallel at a distance to one another and running over the channel regions of the memory cells, bitlines arranged parallel at a distance to one another and running across said wordline stacks, and local interconnects provided for electric connections between the source/drain regions and the bitlines, each local interconnect connecting two of the source/drain regions and one of the bitlines and comprising an electrically conductive silicon or polysilicon bridge that is arranged above the shallow trench isolations and preferably essentially at the level of the main surface of the semiconductor body so that the silicon or polysilicon bridge contacts the adjacent source/drain regions at their lateral vertical boundaries.

This arrangement enables a method for producing this memory cell array by first producing the shallow trench isolations, which are partly removed in subsequent production steps to form upper openings provided for the local interconnects, and by a selective deposition of silicon into these openings at lateral surfaces of the semiconductor body at the locations, where the source/drain regions are to be formed by implantation of doping atoms.

In one aspect, the present invention provides a memory cell array comprising charge-trapping memory cells and local interconnects that avoid a misalignment of the local interconnects relative to the source/drain regions and which is nonetheless easily produced.

In another aspect, the invention provides a method of producing an arrangement of charge-trapping memory cells comprising local interconnects, which avoids the misalignment of the contacts relative to the source/drain regions. The preferred production method is easily reproducible.

BRIEF DESCRIPTION OF THE DRAWINGS

Embodiments and examples of the invention are further described in detail in conjunction with the accompanying drawings, in which:

FIG. 1 shows a cross section of a first intermediate product of a preferred example of the inventive method;

FIG. 2 shows a plan view onto the intermediate product according to FIG. 1 in the direction of the arrow;

DETAILED DESCRIPTION OF ILLUSTRATIVE EMBODIMENTS

Figure 3:
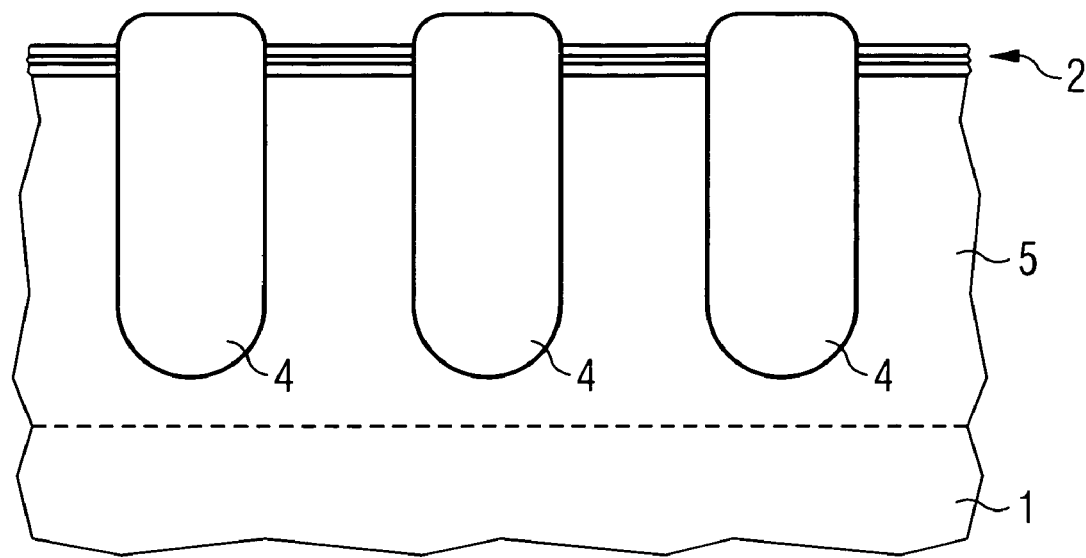
FIG. 3 shows the cross-section according to FIG. 1 of a second intermediate product after further process steps.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The charge-trapping memory cell array will now be described in connection with the preferred method of production. The first steps of this method are directed to the production of the memory layer sequence, which is preferably an oxide-nitride-oxide layer sequence. FIG. 1 shows a cross-section of a semiconductor body 1 comprising a main surface, on which the memory layer sequence is applied instead of the usual pad oxide layer. The memory layer sequence 2 comprises a memory layer or storage layer 22 between a bottom confinement layer 21 and a top oxide layer 23 to be substituted with a top confinement layer, which will be produced in its definite form only after subsequent production steps. In this stage of the method, the third layer is formed by the top oxide layer 23, which is covered by a pad nitride layer 3. A lithography step follows, by which the areas of the shallow trench isolations 4 are delimited. The trenches of the shallow trench isolations are etched by use of the mask that is prepared by the lithography. The trenches are filled with dielectric material to form the shallow trench isolations 4.

FIG. 2 shows the plan view in the direction of the arrow in FIG. 1. This plan view shows that the shallow trench isolations 4 are arranged parallel to one another at a certain distance from one another, the interspaces being spanned by strips of the intermediate pad nitride layer 3. The orientation of the cross-section of FIG. 1 is designated by the broken line in FIG. 2.

After the removal of the pad nitride layer 3, preferably by an etching step, wells 5, shown in the cross-section of FIG. 3, are implanted. The wells 5 are provided as a basic doping for the channel regions and the source/drain junctions. The etching step to remove the pad nitride layer 3, preferably a wet etch, is selective to the oxide of the top oxide layer 23. The upper edges of the dielectric material of the shallow trench isolations 4, which may be oxide as well, are rounded to a certain degree, which is also shown in FIG. 3, although not necessarily to scale. The rounding is caused by several wet cleans in combination with the subsequent anneal step.

A further lithography step is performed to etch the top oxide layer 23 and also the lower layers of the memory layer sequence 2, where it is desired according to the individual transistor structures of either the cell transistors or the periphery transistors of the addressing logic circuit. These transistors can include low voltage and high voltage transistors. Gate oxides of different thicknesses are grown or deposited accordingly.

Figure 4:
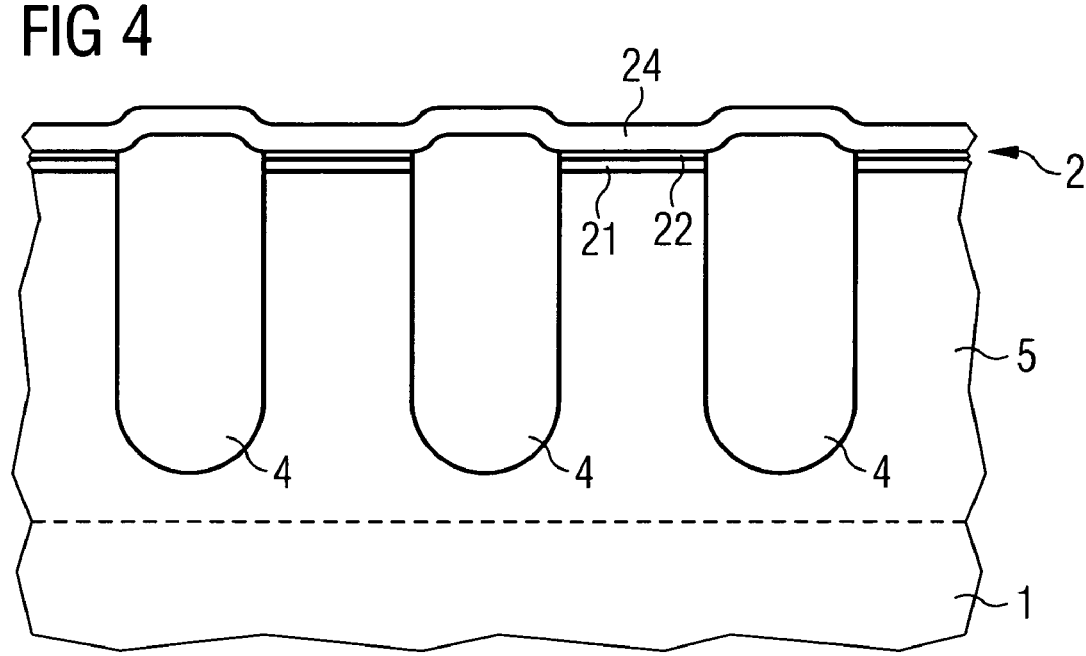
FIG. 4 shows the cross-section according to FIG. 3 of a third intermediate product after further process steps.

FIG. 4 shows that in the area of the memory cell array the top confinement layer 24 is formed to finish the memory layer sequence 2. The top confinement layer 24 is preferably oxide. This oxide may consist in part of re-oxidized nitride and deposited oxide of high quality such as HTO (high-temperature oxide). Therefore, it covers the total area of the memory cell array, including the shallow trench isolations 4.

Figure 5:
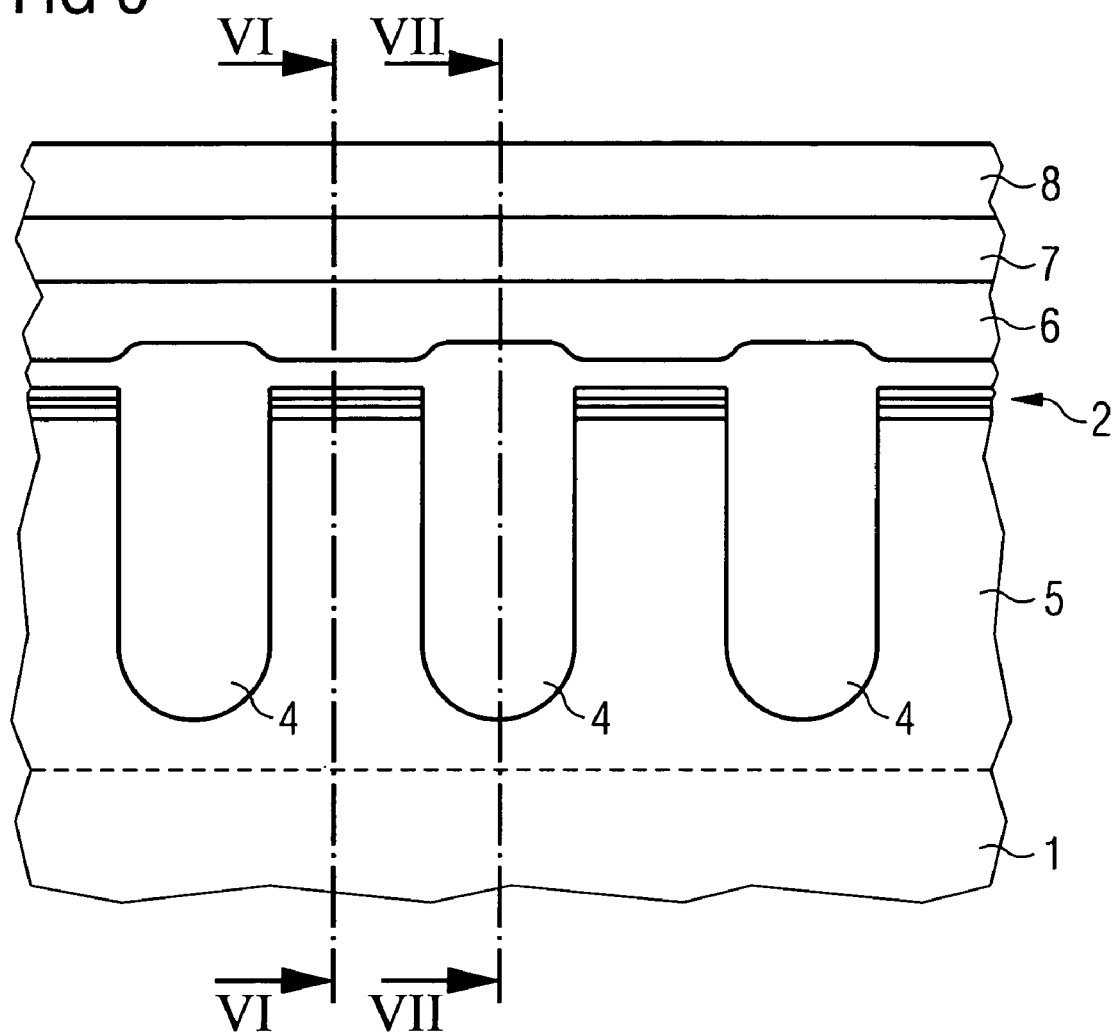
FIG. 5 shows the cross-section according to FIG. 4 of a fourth intermediate product after further process steps.

Next, the stacks of the gate electrodes and wordlines are produced by first depositing the appropriate layers shown in FIG. 5. A gate electrode layer 6, which is preferably electrically conductive polysilicon, is applied directly to the upper surface of the top confinement layer 24. Then, a wordline layer 7, preferably a metallic layer of W, WSi or WN, of low electric resistivity is deposited, which is covered with a hardmask layer 8, preferably of silicon nitride. This layer sequence is depicted in FIG. 5, which also shows the locations of the cross-sections according to FIGS. 6 and 7.

Figure 6:
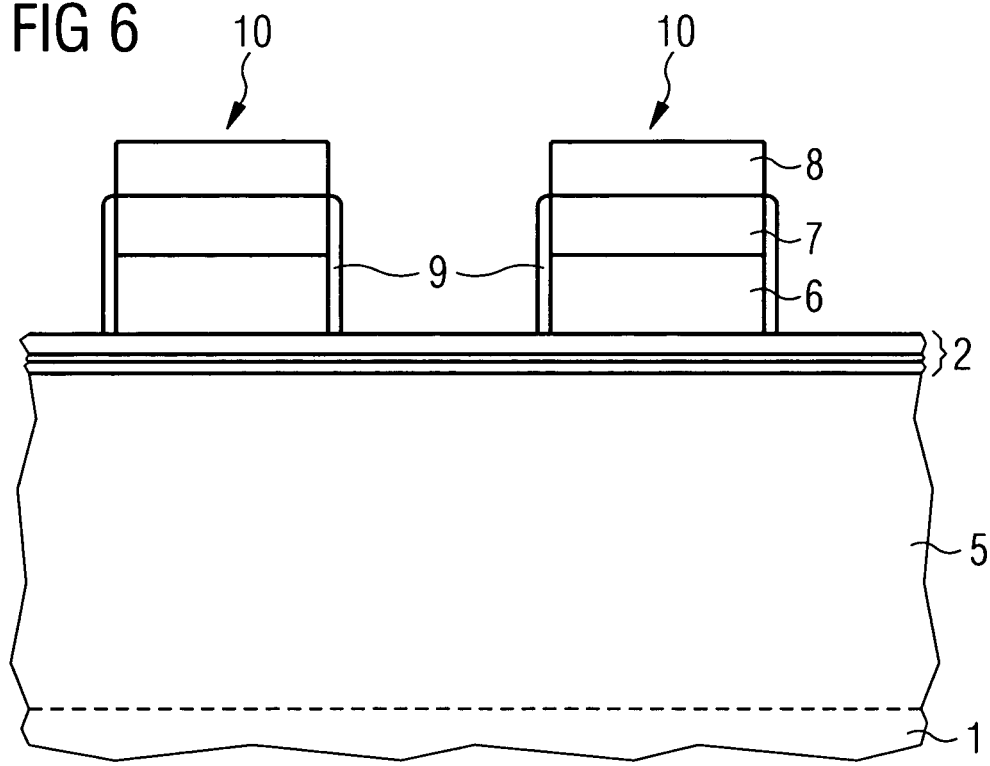
FIG. 6 shows the cross-section across the wordline stacks at the first location indicated in FIG. 5.

FIG. 6 shows the section across the wordlines at the location of the left broken line in FIG. 5 after the structuring of the wordline stacks 10 running parallel to one another in the direction across the shallow trench isolations. A sidewall insulation is preferably formed to cover the sidewalls of the gate electrode layer 6 and the wordline layer 7. If these layers comprise semiconductor material, preferably silicon, it can be oxidized to form the sidewall insulation of sidewall oxide 9. The hardmask layer 8 remains to form strips of upper electric insulations on the wordline stacks 10. Above the channel regions of the memory cell transistors, the gate electrode layer 6 forms a respective gate electrode, which is separated from the channel by the intermediate memory layer sequence 2.

Figure 7:
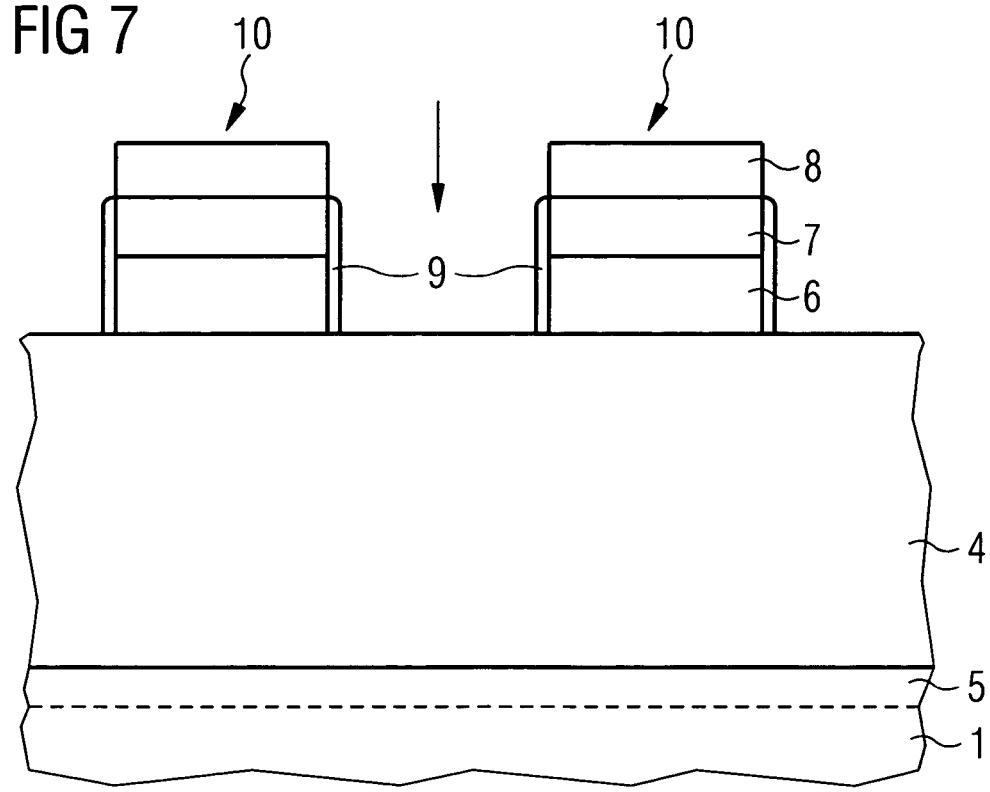
FIG. 7 shows the cross-section across the wordline stacks at the second location indicated in FIG. 5.

FIG. 7 shows the section across the wordline stacks 10, but shifted in comparison to the cross-section of FIG. 6 into the region of the shallow trench isolation 4 (see FIG. 5, right broken line). The other reference numerals are the same as in FIG. 6 and designate the same parts.

Figure 8:
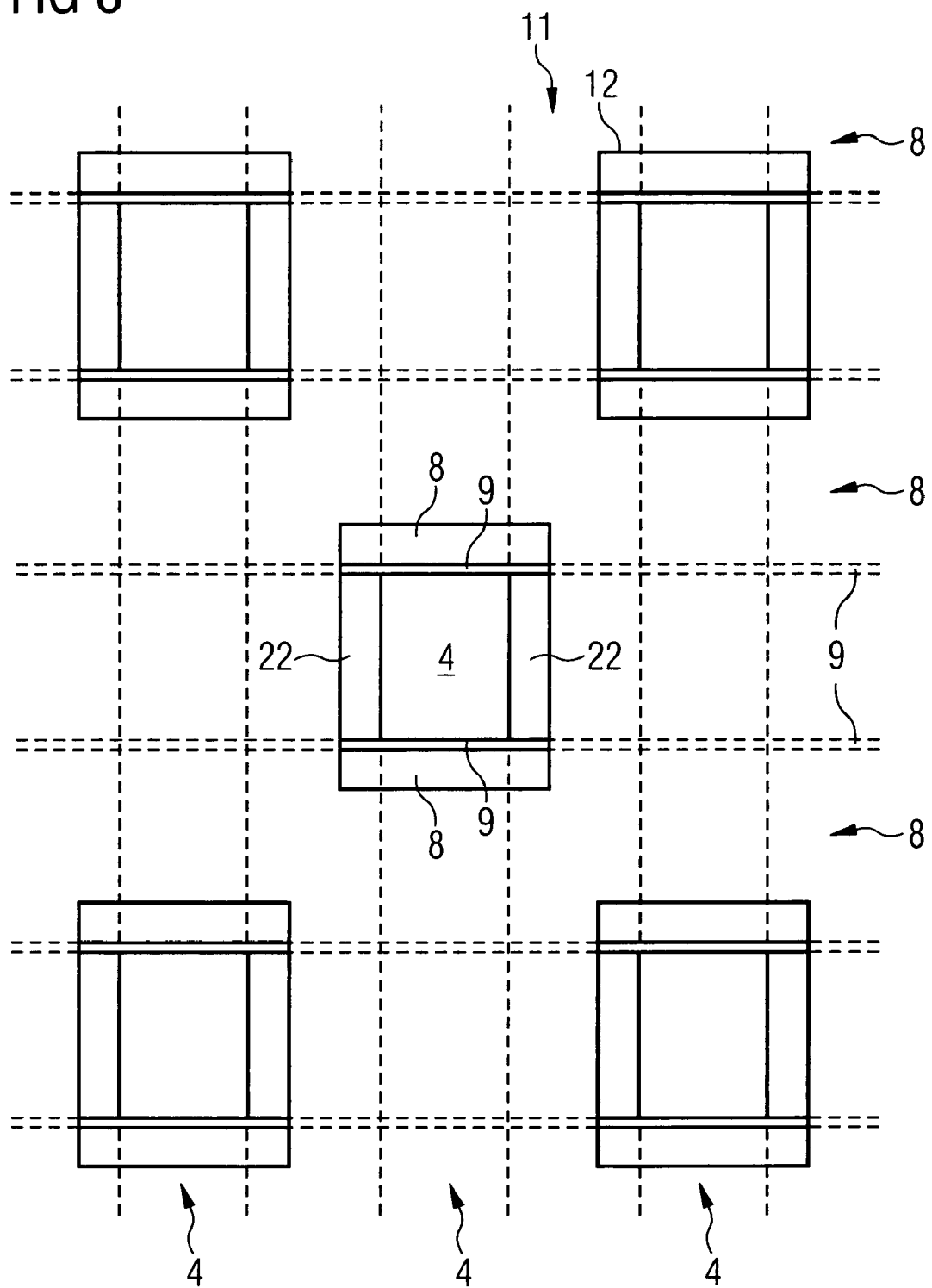
FIG. 8 shows the plan view in the direction of the arrow in FIG. 7 after the application of a mask.

FIG. 8 shows a plan view onto the main surface after the application of a further mask 11 comprising windows 12 in the regions of the silicon or polysilicon bridges to be produced. FIG. 8 shows the location of the shallow trench isolation 4 and of the wordline stacks, of which the hardmask layer 8 is the uppermost layer beneath the mask 11. The sidewall oxides 9 are also indicated in FIG. 8. The openings of the windows 12 expose the marginal regions of the memory layer sequence 2 so that a subsequent oxide etch removes the top confinement layer 24 within these regions to expose the storage layer 22. The etching process is performed in the usual way using an anti-reflective coating and removing the oxide selectively to the material of the storage layer 22, preferably silicon nitride. If this etching step is performed sufficiently anisotropically, the sidewall oxide 9 remains at least at lower parts of the wordline stacks as an electric insulation of the semiconductor material of the gate electrode layer and the wordline layer. The sidewall insulation can also be restored, if necessary, after the etching.

Figure 9:
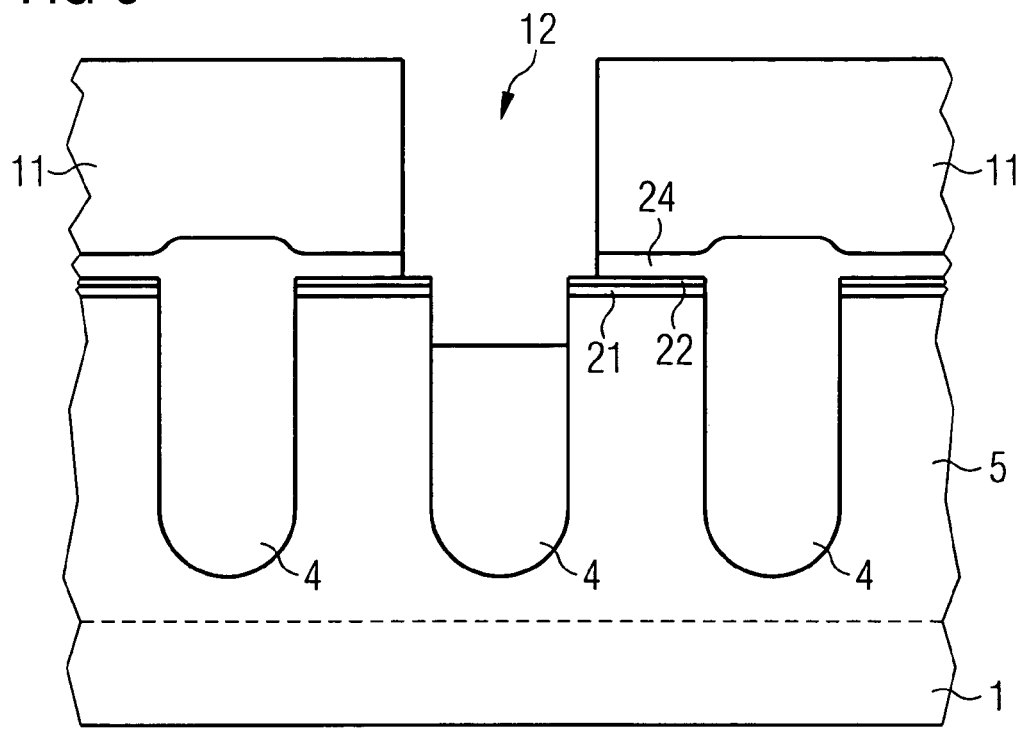
FIG. 9 shows the cross-section according to FIG. 5 of the fifth intermediate product after further process steps.

FIG. 9 shows the cross-section according to FIG. 5, but shifted in the direction of the shallow trench isolations into the region between the wordline stacks. This cross-section shows the result of the etching step. In the areas of the openings 12 of mask 11, the upper part of the shallow trench isolation 4 has been removed so that the semiconductor material is exposed at the sidewalls of the trenches. The upper part of the semiconductor body adjacent to these partly opened trenches is intended to form the source/drain regions of the cell transistors. These areas are bridged by selectively deposited silicon, which forms silicon or polysilicon bridges. The deposited silicon retains the crystalline structure of the substrate, but is prone to crystal defects especially at the locations of growth boundaries. The silicon or polysilicon bridges are later doped to be electrically conductive of the same conductivity type as the source/drain regions.

Figure 10:
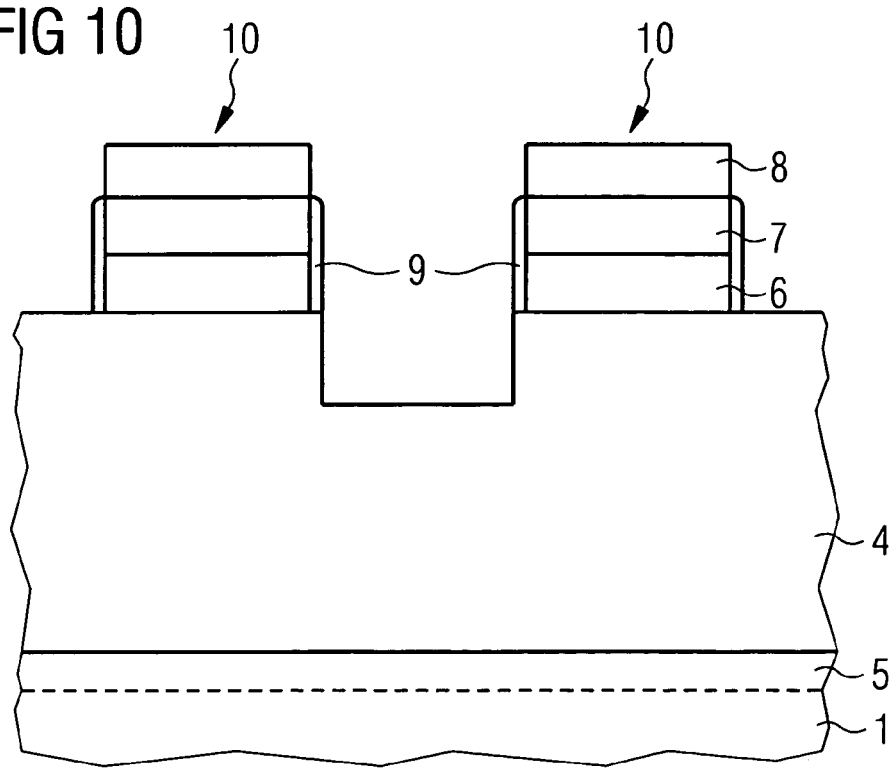
FIG. 10 shows the cross-section according to FIG. 7 of the intermediate product of FIG. 9.

FIG. 10 shows the cross-section according to FIG. 7 after the etching of the shallow trench isolation 4 to form the openings provided for the deposition of the silicon or polysilicon bridges. The silicon or polysilicon bridges will extend with their longitudinal direction perpendicularly to the drawing plane of FIG. 10.

Figure 11:
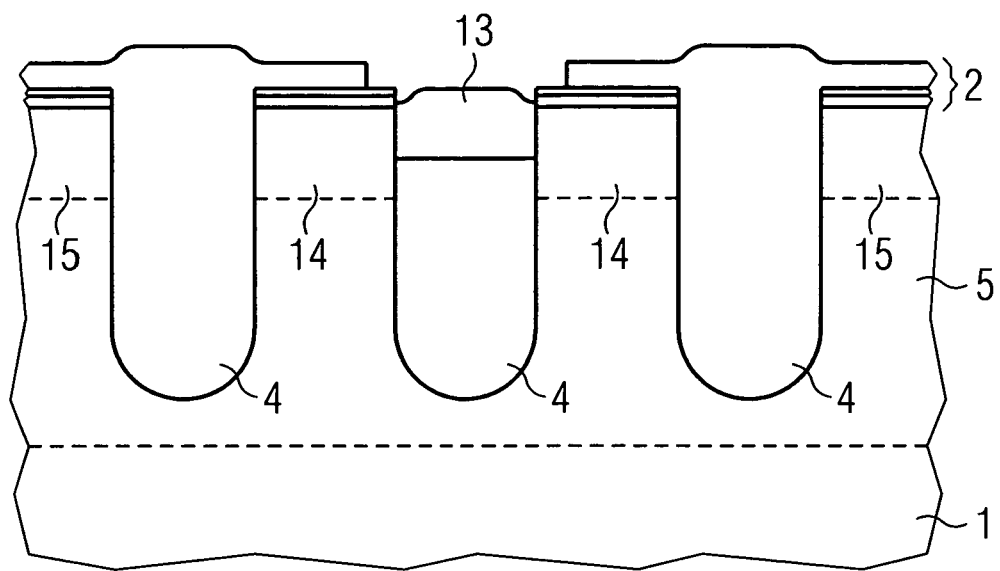
FIG. 11 shows the cross-section according to FIG. 9 after the deposition of the silicon or polysilicon bridges.

FIG. 11 shows the result of the silicon deposition to form the silicon or polysilicon bridges 13 in the cross-section according to FIG. 9, after the removal of the mask 11. The silicon or polysilicon bridges are formed by a selective silicon deposition, which can be performed, preferably after an HF-dip to clean the semiconductor surface. Then a residue desorption step is typically applied at about 850° C. for 1 to 5 minutes. 30 nm of silicon are grown selectively on the silicon surface at 850° C. within about 1 minute. After this deposition of the silicon or polysilicon bridges 13, highly doped source/drain regions 14, 15 are formed by an implantation of doping atoms. Preferably, a combination of a pocket implant, an application of spacers and a subsequent $n^+$-implant is performed. By this implantation, also the silicon or polysilicon bridges 13 can be doped to render the silicon or polysilicon electrically conductive. FIG. 11 shows one local interconnect comprising the silicon or polysilicon bridge 13 and the adjacent source/drain regions 14. The neighbouring source/drain regions 15 form part of the subsequent local interconnects that join to the left and right sides of the partial section shown in the figure.

Figure 12:
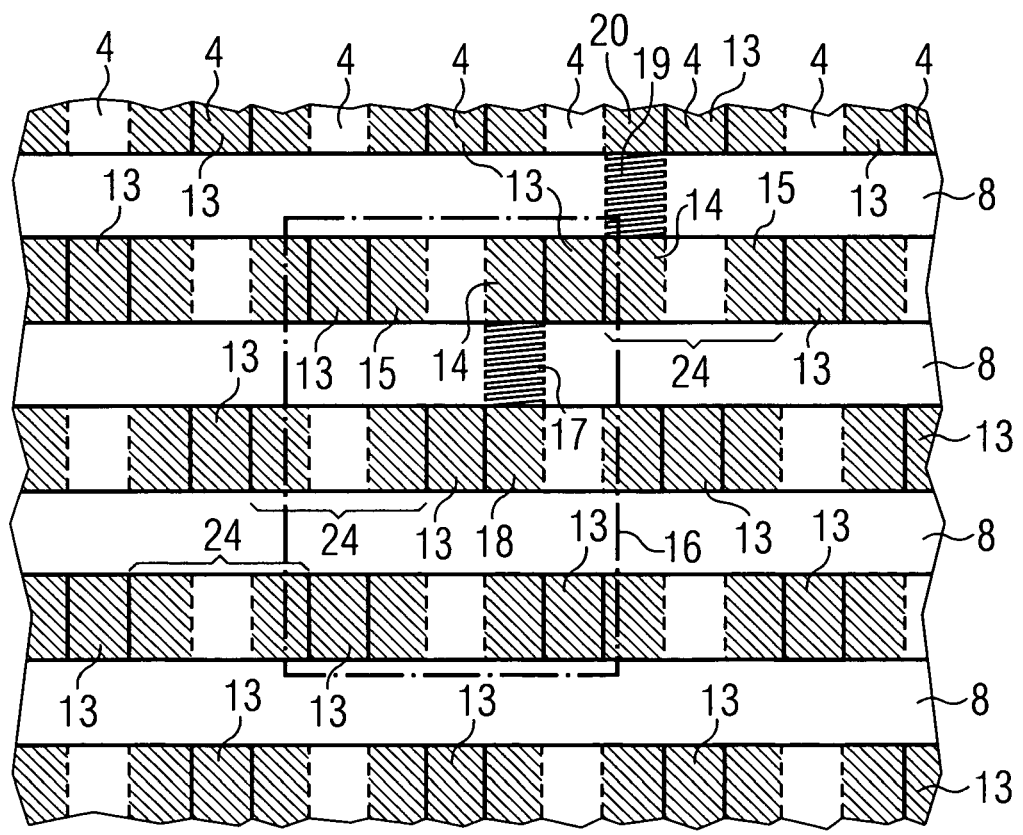
FIG. 12 shows a plan view of the arrangement of the local interconnects.

The arrangement of the local interconnects can be understood more clearly from FIG. 12, which shows a plan view onto the hardmask layer 8 on top of the wordline stacks and the local interconnects between the wordline stacks, which are highlighted by the hatching in FIG. 12. The area 16 which is surrounded by the broken line corresponds to the area of the plan view shown in FIG. 8. The source/drain regions 14 with their intermediate silicon or polysilicon bridge 13 belong to two different transistor cells with channel regions 17 and 19, shown in very narrow hatching. The memory cell comprising channel region 17 also comprises further source/drain region 18, while the memory cell comprising channel region 19 also comprises further source/drain region 20.

The transistor cells comprising channel regions 17 and 19 are situated diagonally to one another with respect to the wordlines and the bitlines. They form a quadruple of memory cells together with the two adjacent memory cells situated on the other diagonal direction. The local interconnect 13 bridging the source/drain regions 14 connects the first source/drain regions of these four memory cells. In this arrangement, each of these memory cells forms a first memory cell of a further quadruple of memory cells, its second source/drain region being connected by another local interconnect to first source/drain regions of the other three memory cells of the further quadruple. The local interconnects of adjacent gaps between the wordline stacks are shifted in the direction of the wordlines by half the distance between the centers of subsequent silicon or polysilicon bridges 13. Therefore, on one side of one selected wordline, odd-numbered source/drain regions are connected to even-numbered source/drain regions, while on the other side of this wordline even-numbered source/drain regions are connected to odd-numbered source/drain regions. The bitlines run along the direction of the shallow trench isolations 4 and are preferably arranged above the shallow trench isolations 4 to contact the local interconnects on their silicon or polysilicon bridges 13 in every second gap between the wordline stacks.

The structure of the memory cell array comprising silicon or polysilicon bridges as part of the local interconnects and the corresponding production method enable the arrangement of the local interconnects in a self-aligned manner so that they are adjusted with respect both to the bitlines and the wordlines. The complete process performance is involved in achieving this result in that the ONO-layer sequence or other memory layer sequence suitable for charge-trapping is applied and structured before the shallow trench isolations, and the silicon deposition takes place before the source/drain implantation. The memory layer sequence, especially the nitride storage layer, is used to remove the filling of a shallow trench isolation selectively in order to form upper openings or recesses provided for the silicon or polysilicon bridges. The source/drain implantations take place after the selective deposition of silicon at high temperatures so that the diffusion of the implant can sufficiently be restricted. By the application of the silicon or polysilicon bridges, any misalignment of the local interconnects relative to the source/drain regions can be avoided, as the local interconnects are produced in a self-aligned manner both with respect to the bitlines and to the wordlines and no sublithography dimensions have to be produced. This is made possible by the use of a selective silicon deposition, which renders the complete production method comparatively easy and makes the production easily reproducible. The contacts of the source/drain regions that are connected by the local interconnects can be structured in completely symmetric fashion by the inventive method. This renders an ideally miniaturized, strictly periodically structured memory cell array.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for producing a charge-trapping memory cell array, the method comprising:
   providing a semiconductor body having a main surface;
   forming a layer sequence on said main surface, the layer sequence including a storage layer;
   etching trenches arranged parallel at a distance to one another in said semiconductor body at said main surface;
   filling said trenches with a dielectric material to form shallow trench isolations;
   implanting a dopant to form a well of a first conductivity type;
   forming wordline stacks running across said shallow trench isolations;
   removing upper parts of said shallow trench isolations in regions provided for local interconnects, thereby forming recesses and exposing lateral surfaces of said semiconductor body in said trenches above remaining lower parts of said shallow trench isolations; and
   forming conductive bridges in the recesses of the shallow trench isolations to fill said recesses between said lateral surfaces above said lower part of said shallow trench isolations.

2. The method of claim 1 and further comprising implanting a dopant for a second electric conductivity type opposite to said first conductivity type, thereby forming source/drain regions and said local interconnects in regions between said wordline stacks and between remaining upper parts of said shallow trench isolations.

3. The method of claim 2 and further comprising forming connecting vias that are electrically insulated from one another and from said wordline stacks to contact said local interconnects from above.

4. The method of claim 1 and further comprising forming oxides on sidewalls of said wordline stacks.

5. The method of claim 1 wherein the wordline stacks are formed by depositing a gate electrode layer, a wordline layer of electrically conductive material, and a hardmask layer and structuring these layers by means of said hardmask layer to form said wordline stacks.

6. The method of claim 1 wherein the conductive bridges are formed from polysilicon or silicon.

7. The method of claim 6 wherein the conductive bridges are formed by selective silicon deposition at said lateral surfaces.

8. The method of claim 1 and further comprising:
   filling polysilicon into gaps between said wordline stacks, said polysilicon being made electrically conductive by a dopant;
   structuring said polysilicon to form connecting vias; and
   filling a dielectric material provided as electric insulation between said connecting vias.

9. The method of claim 1 and further comprising:
   filling a dielectric material into gaps between said wordline stacks;
   forming contact holes in said dielectric material; and
   filling said contact holes with electrically conductive material to form conducting vias.

10. The method of claim 1 wherein the layer sequence includes an oxide layer.

11. The method of claim 10 wherein the storage layer comprises a nitride layer.

12. A method for producing a charge-trapping memory cell array, the method comprising:
    providing a semiconductor body having a main surface;
    forming a layer sequence on said main surface comprising a bottom confinement layer, a storage layer and a preliminary top layer;
    etching trenches arranged parallel at a distance to one another in said semiconductor body at said main surface;
    filling said trenches with a dielectric material to form shallow trench isolations;
    implanting a dopant to form a well of a first conductivity type;
    removing said preliminary top layer at least from areas of said main surface and forming gate oxides, thereby applying said top confinement layer;
    depositing a gate electrode layer, a wordline layer of electrically conductive material, and a hardmask layer and structuring these layers by means of said hardmask layer to form wordline stacks running across said shallow trench isolations;
    forming oxides on sidewalls of said wordline stacks;
    applying a mask having windows in regions provided for local interconnects;
    removing upper parts of said shallow trench isolations in said regions provided for said local interconnects, thereby forming recesses and exposing lateral surfaces of said semiconductor body in said trenches above remaining lower parts of said shallow trench isolations;
    forming silicon or polysilicon bridges provided for said local interconnects by selective silicon deposition at said lateral surfaces to fill said recesses between said lateral surfaces above said lower parts of said shallow trench isolations;
    removing said mask;
    implanting a dopant for a second conductivity type opposite to said first conductivity type, thereby forming said source/drain regions and said local interconnects in regions between said wordline stacks and between remaining upper parts of said shallow trench isolations; and
    forming connecting vias that are electrically insulated from one another and from said wordline stacks to contact said local interconnects from above.

13. The method of claim 12 and further comprising:
    filling polysilicon into gaps between said wordline stacks, said polysilicon being made electrically conductive by a dopant;
    structuring said polysilicon to form said connecting vias; and
    filling a dielectric material provided as electric insulation between said connecting vias.

14. The method of claim 12 and further comprising:
    filling a dielectric material into gaps between said wordline stacks;
    forming contact holes in said dielectric material; and
    filling said contact holes with electrically conductive material to form said conducting vias.

15. The method of claim 12 and further comprising forming said bottom and top confinement layers of oxide.

16. The method of claim 12 and further comprising forming said storage layer of nitride.

17. The method of claim 12 and further comprising:
    arranging said local interconnects in such a fashion that in a first quadruple of memory cells comprising a first memory cell, a second memory cell that is adjacent to said first memory cell in a direction of the wordlines, and a third memory cell and a fourth memory cell that are adjacent to sad first and second memory cells, respectively, in a direction of the bitlines, and her comprising a first source/drain region of said first memory cell, a first source/drain region of said second memory cell, a first source/drain region of said third memory cell, and a first source/drain region of said fourth memory cell, said first source/drain regions are electrically connected by a first one of said local interconnects, said memory cells of said first quadruple forming first memory cells of a second, third, fourth, and fifth quadruple of memory cells arranged like the first quadruple; and a second source/drain region of each of said memory cells of the first quadruple is electrically connected to first source/drain regions of a second, third, and fourth memory cell of the respective second, third, fourth or fifth quadruple of memory cells by a second, third, fourth, and fifth one, respectively, of said local interconnects.

* * * * *

UNITED STATES PATENT AND TRADEMARK OFFICE
CERTIFICATE OF CORRECTION

PATENT NO. : 6,972,226 B2
DATED : December 6, 2005
INVENTOR(S) : Deppe et al.

It is certified that error appears in the above-identified patent and that said Letters Patent is hereby corrected as shown below:

Column 7,
Line 24, delete "part" insert -- parts --.

Column 8,
Line 65, delete "sad" insert -- said --.
Line 66, delete "her" insert -- further --.

Signed and Sealed this

Twenty-eighth Day of February, 2006

JON W. DUDAS
*Director of the United States Patent and Trademark Office*